United States Patent [19]
Homma et al.

[11] Patent Number: 5,747,427
[45] Date of Patent: May 5, 1998

[54] PROCESS FOR FORMING A SEMICONDUCTIVE THIN FILM CONTAINING A JUNCTION

[75] Inventors: Norio Homma, Hokkaido; Tadataka Morishita, Tokyo, both of Japan

[73] Assignees: Hokkaido Electric Power Co., Inc.; International Superconductivity Technology Center, both of Japan

[21] Appl. No.: 638,286

[22] Filed: Apr. 26, 1996

Related U.S. Application Data

[63] Continuation of Ser. No. 450,523, May 25, 1995, abandoned, which is a continuation-in-part of Ser. No. 216,763, Mar. 22, 1994, abandoned, which is a continuation of Ser. No. 969,795, Oct. 30, 1992.

[30] Foreign Application Priority Data

Nov. 15, 1991 [JP] Japan ................... 3-300820

[51] Int. Cl.⁶ .......................... C23C 14/34
[52] U.S. Cl. ............... 505/476; 505/475; 505/473; 204/192.24; 204/192.22; 204/192.25
[58] Field of Search ............... 204/192.22, 192.24, 204/192.25; 505/473, 475, 476, 730, 731

[56] References Cited

U.S. PATENT DOCUMENTS

| | | | |
|---|---|---|---|
| 4,874,494 | 10/1989 | Ohmi | 204/298.08 |
| 5,075,281 | 12/1991 | Testardi | 505/192 |
| 5,096,882 | 3/1992 | Kato | 505/325 |
| 5,106,821 | 4/1992 | Homma et al. | 204/192.24 |
| 5,121,173 | 6/1992 | Wilson | 505/160 |
| 5,151,408 | 9/1992 | Tanaka et al. | 505/476 |
| 5,151,409 | 9/1992 | Hiratani | 505/125 |

FOREIGN PATENT DOCUMENTS

| | | |
|---|---|---|
| 0390704 | 3/1989 | European Pat. Off. |
| 0 329 507 | 8/1989 | European Pat. Off. |
| 0 390 704 | 10/1990 | European Pat. Off. |
| 63-239990 | 10/1988 | Japan |
| 64-11378 | 1/1989 | Japan |
| 64-12585 | 1/1989 | Japan |
| 1-183176 | 7/1989 | Japan ................ 204/192.24 |
| WO 89/08335 | 9/1989 | WIPO |

OTHER PUBLICATIONS

Jorgensen et al., "Structural Properties of Oxygen Deficient YBa2Cu3O7-8," Physical Review B, vol. 41, No. 4, 1987, pp. 1863–1877, Feb. 1990.

Tipler, *Physics*, 2nd Ed., 1982, p. 686.

Sahu et al, *Chemistry of High–Temperature Superconductors II*, ACS, 1988, Chapter 1.

Oishi et al, *Applied Phys. Lett*, vol. 59 (15), Oct. 7, 1991, pp. 1902–1904.

Hirata et al, *Applied Phys. Lett*, vol. 56 (7), Feb. 12, 1990, pp. 683–685.

(List continued on next page.)

*Primary Examiner*—R. Bruce Breneman
*Assistant Examiner*—Rodney G. McDonald
*Attorney, Agent, or Firm*—Edward D. Manzo; Mark J. Murphy

[57] ABSTRACT

Disclosed is a method of forming a thin junction film including a first thin oxide flilm presenting a superconductivity and second thin oxide film presenting an insulator properties or possibly semiconductive properties with an improved production efficiency as well as improved film quality and characteristics. Employed are first and second targets each having substantially the same chemical composition excepting oxygen content. The first target is sputtered at a target cathode voltage of minus 100 V by the use of voltage derived from an external D.C. voltage source, thereby forming a first thin oxide film. Subsequently, the target is changed over to the second target while changing the target cathode voltage into self-bias voltage of minus 50 V without any change of the other film formation conditions. Through this change-over, the sputtering of the first target is successively followed by the sputtering of the second target without any interruption of time, to consequently form the second thin oxide film onto the first thin oxide film.

12 Claims, 6 Drawing Sheets

OTHER PUBLICATIONS

Jorgensen et al, "Structural Properties of Oxygen–Deficient YBa2Cu3O7–8," *Physical Review B*, vol. 41, No. 4, 1987, pp. 1863–1877.

Hasegawa et al, *Superconductive Ceramics*, 1987 pp. 82–84 (with translation).

Microelectronic Manufacturing and Testing "Desk Manual," vol. 8, No. 3, 1985, p. 198.

Doss, *Engineer's Guide to High–Temperature Superconductivity*, 1989, pp.152–157.

"Fundamentals, Applications and Techniques for Experiments of Superconductivity," Chapter 5, (Kind of Josephson Junction), Kabushiki Kaisha I.P.C., Jan. 10, 1989, pp. 142–143, (with translation).

"Solid State Physical Electronics," Chapter 10.1, (Feature of Metal), Corona Publishing Co., Ltd., Jan. 10, 1988, p. 193 (with translation).

Hatano et al, "Unique Method of Patterning Superconducting Thin Films by Selective Growth of Y–Ba–Cu–O," *Japanese Journal of Applied Physics*, vol. 29, No. 6, Jun. 1990, pp. 1076–1079.

Sakuta et al, "Selective Heteroepitaxial Growth of (100–MgO/(001)–Y1Ba2Cu3Oy on MgO Substrate and its Superconductivity," *Japanese Journal of Applied Physics*, vol. 29, No. 9, Sep. 1990, pp. 1668–1674.

FIG_2

FIG_3

PROCESS FOR FORMING A SEMICONDUCTIVE THIN FILM CONTAINING A JUNCTION

This application is a continuation of U.S. application Ser. No. 08/450,523, filed on May 25, 1995 now abandoned which is a continuation-in-part of application Ser. No. 08/216,763 filed Mar. 22, 1994 now abandoned which is a continuation of U.S. application Ser. No. 07/969,795 filed Oct. 30, 1992.

BACKGROUND OF THE INVENTION

FIELD OF THE INVENTION

The present invention relates to a thin oxide film, and more particularly is directed to a thin oxide junction film including a first thin film made of an oxide and presenting a superconductivity and a second thin film made of an oxide and presenting an insulating property or semiconducting property. This invention further concerns a process of forming the thin oxide film described above.

DESCRIPTION OF THE RELATED ARTS

Up to now, research studies have been conducted on a variety of devices using, for example, Josephson elements, superconducting circuitry and superconductors, and their practical applications. For the purpose of manufacturing practical devices using such superconductors, an attempt to form a junction film consisting of a superconductor and an insulator (or a semiconductor) continues to be made. A known process of forming such junction film is disclosed in, for example, Reference I: "Jpn. J. Appl. Phys. 29 (1990), p. 1668 or p. 1076".

The process disclosed in this reference aims at not only the formation of a thin oxide superconductor film and thin oxide insulator (or oxide semiconductor) film but also the formation of a junction film consisting of the thin oxide superconductor film and thin oxide insulator (or oxide semiconductor) film with the aid of high-frequency (RF) magnetron sputtering method. The thin oxide superconductor film which has been referred to herein means a thin oxide film exhibiting superconductivity when cooled down to an extremely low temperature range, while the thin oxide insulator (oxide semiconductor) film means a thin oxide film presenting usually a semiconductive characteristic but capable of being used as an insulator in an extremely low temperature range. For the convenience of the following description, the thin oxide film exhibiting superconductivity is referred to as a first thin oxide film, while the thin oxide film usually exhibiting semiconductor but capable of being used as an insulator when the temperature is extremely low is referred to as a second thin oxide film. There is generally supposed to be two processes of forming a thin oxide junction film including at least two layers by separately forming both the thin oxide films.

(1) The first process of film formation comprises the steps of providing targets made of the same constituent elements; and changing desired formation conditions among film formation conditions (for example, kind of sputtering gas to be used, gas pressure, substrate temperature, discharge frequency, input power and others) excepting the target and a target cathode voltage.

(2) The second process of film formation comprises the steps of providing targets each made of different constituent elements, and changing over from a target to another target without changing the other film formation conditions (for example, target cathode voltage, kind of sputtering gas to be used, gas pressure, substrate temperature, discharge frequency, input power and others) or alternatively with the change of desired film formation conditions among these conditions.

The above-described first conventional process unfortunately involves the following problems as long as first and second thin oxide films each having the same chemical composition are separately formed by the same deposition system with the aid of a sputtering method utilizing a high-frequency discharge.

When forming in accordance with the conventional first process, a junction film consisting of the first thin oxide film comprising $YBa_2Cu_3O_x$ film (note that x represents oxygen ratio) and the second thin oxide film comprising $YBa_2Cu_3O_y$ film (note that y represents oxygen ratio), the junction film must be usually fully oxidized so as to obtain superconductivity characteristic in the first thin oxide film after the completion of film formation. At that time, the oxidation of the second thin oxide film also adversely proceeds to consequently show superconductivity, which is a reason why the conventional process has not yet provided such a junction film.

According to the second conventional process, the targets each made of different constituent elements are correspondingly used to separately form first and second thin oxide films, so that the first and second thin oxide films have different chemical compositions, thus resulting in an interdiffusion between both the thin oxide films having different compositions, which inconveniently leads to deterioration in the film characteristics.

Besides, according to the second known process, the film formation conditions excepting the target and the target cathode voltage are possibly changed as described above. Consequently, there arises a need to change the kind of sputtering gas, gas pressure, substrate temperature, discharge frequency, input power and the like. This may bring about an interruption of time in the film formation process and hence may lower the production efficiency.

Aside from this, the deposition chamber is not usually entirely evacuated of contaminants which are suspended therein. Hence, if there is a waiting period for the initiation of the second thin oxide film formation after the completion of the first thin oxide film formation, the surface of the first film is contaminated. As a result, the interface of the junction between the first and second thin oxide films is not satisfactory, and therefore the junction characteristics between both the films are also deteriorated. Since this junction film involves contaminant in the interfacial area between the first and second thin oxide films or involves a film region subjected to a change in quality due to the contaminant, it is actually difficult to say that the junction film in which the first thin oxide film is contiguous with the second thin oxide film is successfully formed irrespective of the nominal thin oxide junction film including the first and second thin oxide films.

Furthermore, there is no report that the thin oxide film consisting of the first and second thin oxide films being in contact with each other and having the same chemical composition excepting oxygen content has been successfully formed, by the use of the targets made of the same constituent elements as well as the same sputtering gas.

SUMMARY OF THE INVENTION

It is therefore a first object of the present invention to provide a thin oxide film of layered structure including two or more layers which does not undergo a deterioration in interfacial characteristics at its junction interface.

It is a second object of the present invention to provide a process of successively lorming without any interruption a thin oxide film of layered structure including two or more layers superior in junction properties as well as Film properties.

In order to achieve the first object, a thin oxide film in accordance with the present invention comprises a first thin oxide film presenting semiconductivity; a second thin oxide film presenting ordinarily a semiconcluctive property but capable of being used as an insulator in an extremely low temperature range; and a junction lying between the first thin oxide film and the second thin oxide film.

The first and second thin oxide films have the same chemical composition excepting oxygen content and have substantially the same lattice constant.

For the execution of this invention, preferably at least one junction is included.

Furthermore at the time of practicing this invention, preferably the first and second thin oxide films each comprise Y(yttrium)—Ba(barium)—Cu(copper)—O(oxygen) thin film ("YBCO").

Moreover, to carry out the invention, preferably cation ratio, that is, a chemical compositional ratio among Y, Ba and Cu of the Y—Ba—Cu—O thin film is 1:2:3 for the first thin oxide film while Y:Ba:Cu=1:2:3 or a cation ratio close to this is established for the second thin oxide film.

Besides, when performing this invention, preferably the first thin oxide film comprises $YBa_2Cu_3O_x$ film (x representing oxygen ratio and being $6.35<x<7$) and the second thin oxide film comprises $YBa_2Cu_3O_y$ (y representing oxygen ratio and being $6<y<6.35$). Namely, the first and second oxide films are different in oxygen content from each other, i.e., $x \approx y$.

In order to accomplish the second object of the present invention, according to a process of forming a thin oxide film in which a composite oxide target is sputtered by means of sputtering method using a discharge frequency in accordance with the present invention, the process comprises the steps of forming a first thin oxide film presenting a superconductivity characteristic; and forming a second thin oxide film presenting ordinarily a semiconductive property but capable of being used as an insulator in an extremely low temperature range; the formation of the first and second thin oxide films being separately carried out merely through the changeover of the target to be used and a target cathode voltage to be applied.

For the execution of this invention, preferably a self-bias voltage of the target is used as the target cathode voltage to form the second thin oxide film.

Moreover, for the execution of this invention, preferably the target cathode voltage is impressed by the use of an external D.C. voltage source, thereby to form the first thin oxide film.

At the time of practicing this invention, preferably the first and second thin oxide films are successively formed to provide a junction between the first and second thin oxide films.

Furthermore at the time of practicing this invention, preferably the target and target cathode voltage are in pairs changed over at least one time.

To carry out this invention, preferably the targets for forming the first and second thin oxide films comprise Y(yttrium)—Ba(barium)—Cu(copper)—O(oxygen) target.

Besides, to carry out this invention, preferably the target for forming the first thin oxide film comprises an oxide target having cation ratio, that is, a chemical compositional ratio Y:Ba:Cu=1:3:7, and the target for forming the second thin oxide film comprises an oxide target having cation ratio, that is, a chemical compositional ratio Y:Ba:Cu=1:2:5.

When performing this invention, preferably the discharge frequency is an industrial frequency in a range of at least 13.56 MHz and of at most 94.92 MHz.

Additionally, when performing this invention, preferably the sputtering method is a high-frequency (RF) magnetron sputtering method.

According to the present invention described above, the thin oxide film includes at least one junction lying between the first thin oxide film presenting a superconductivity in a temperature range below a superconducting critical temperature and the second thin oxide film presenting ordinarily a semiconductive characteristic but capable of being used as an insulator in an extremely low temperature range. That is, the second oxide film is characterized in that above about the critical temperature, the second film is semiconductive, and in the temperature range where the first oxide film exhibits superconductivity, the second oxide film is effective as an insulator. The first and second thin oxide films have the same or substantially the same chemical compositional elements Y, Ba, Cu and O and lattice constant. The identity of the cation ratio eliminates the possibility of deterioration in film characteristics. The substantial identity of the lattice constant as well as the identity of the cation ratio ensure a superiority in film quality. In addition, the continuous lormalion of the first and second thin oxide films in one and the same deposition apparatus prevents the contaminant from mixing into the interfacial area of the junction between both the films and prevents the interfacial area From being partially changed in quality due to the contaminant, which also overcomes the fear of deterioration in the film characteristics.

According to the process of forming a thin oxide film of the present invention, the first and second thin oxide films are separately formed merely through the changeover of the target and the target cathode voltage. To this end, a plurality of targets consisting of the same elements may be previously provided within one and the same deposition chamber. Furthermore, outside the deposition chamber there may be provided not only a switch for the changeover of the target cathode voltage but also a desired power source. This ensures a sequential formation of the subsequent thin oxide film onto the previously formed thin oxide film within one and the same deposition chamber without any interruption of time providing that the target and the target cathode voltage are changed over in time with the completion of the formation of the thin oxide film in one hand. In consequence, there can be formed a thin oxide junction film including the first and second oxides each having the same or substantially the same chemical composition excepting oxygen content and free from contaminant mixed into the junction interfacial area between both the thin oxide films, and the area is free from subjected to a change in quality due to the contaminant. In addition, since there is no need to change the flilm formation conditions (except the target and the target cathode voltage) the changeover from one thin oxide film formation to the other thin oxide film formation can be done without any interruption of time. thus improving the production efficiency as compared with the prior art.

BRIEF DESCRIPTION OF THE DRAWINGS

The foregoing and the other objects, features and advantages of the present invention will be better understood from the following description taken in connection with accompanying drawings in which.

DESCRIPTION OF THE PREFERRED EMBODIMENTS

An embodiment of the present invention will now be described with reference to the accompanying drawings.

Figure 1:
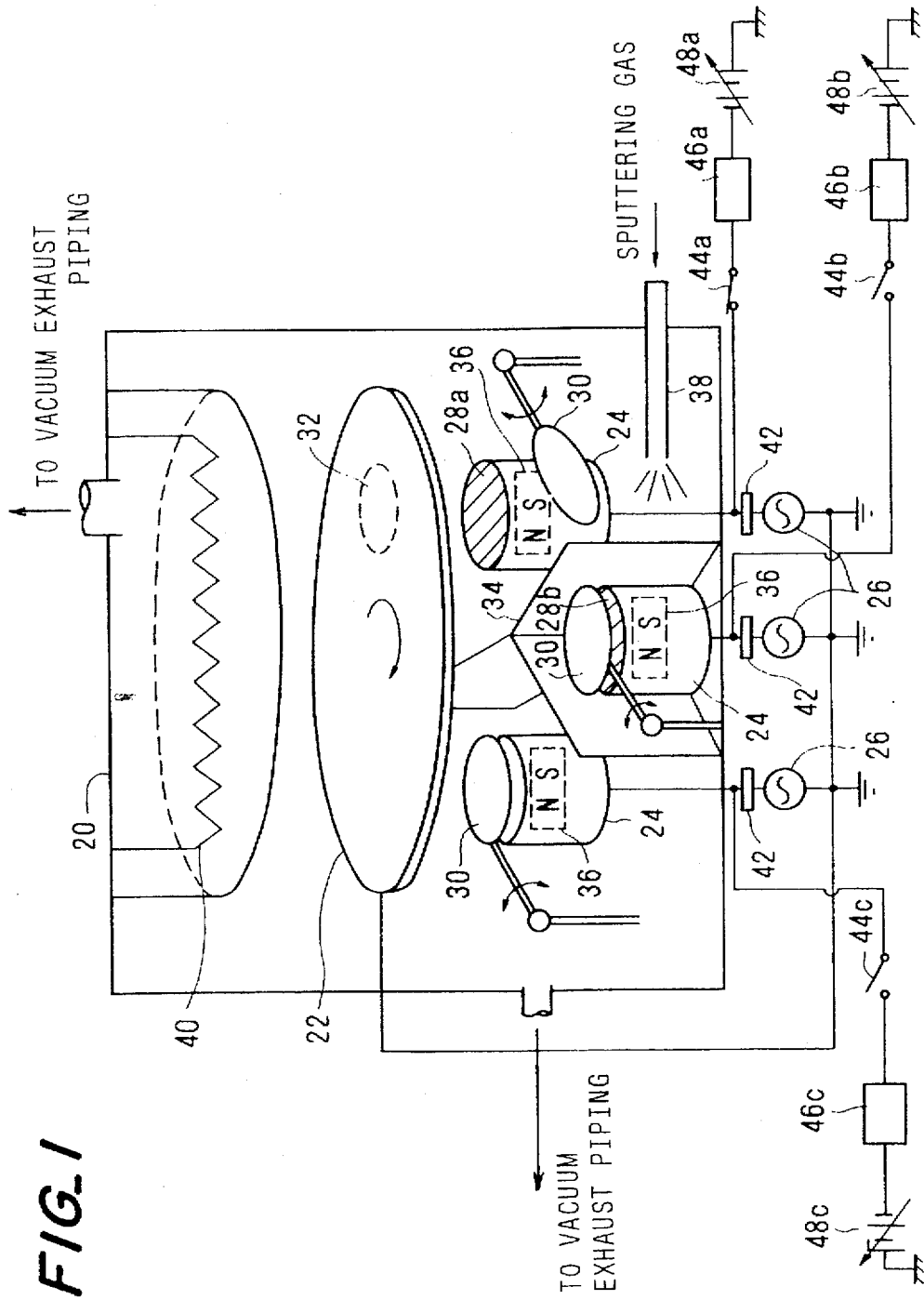
FIG. 1 diagrammatically shows the structure of the principal part of an RF magnetron sputtering system, for the illustration of embodiments of the present invention.

Referring first to FIG. 1, the principal structure of a system employed for practicing the present invention will be diagrammatically reviewed preparatory to starting on the description of the present invention itself. The following is a description of a typical RF magnetron sputtering system by way of example.

This RF magnetron sputtering system includes substantially the same constitutional sections as the conventional ones.

A deposition chamber generally designated at 20 comprises a turntable 22 acting as an anode capable of being freely rotated and fixed, and a plurality of cathodes 24 each facing the anode 22, the distance between the turntable 22 and the RF power source 26 and a matching box 42 are connected in series between the turntable 22 and each of the cathodes 24.

In order to form a thin oxide film by a high-frequency magnetron sputtering using a compound oxide target, this embodiment of the present invention may employ a discharge frequency of 13.56 MHz or more which imparts a negative self-bias voltage capable of depositing onto the target. It is therefore preferable in this embodiment that each of the RF power source 26 be interchangeable with any one of RF power sources of 13.56 MHz, 40.68 MHz, 67.80 MHz, 94.92 MHz and so forth as well as the associated matching box 42.

The upper surfaces of the cathodes 24 are adapted to exchangeably carry targets 28a and 28b (which may be typically represented by 28) thereon. Shutters 30 are rotatably provided to control the sputtering of the targets 28. On the contrary, a substrate 32 serving as a base or underlayer for deposition is mounted on the turntable 22 in such a manner that its surface to be deposited confronts the corresponding cathode 24. A reference numeral 34 denotes a partition for isolation sputtering to be performed for each of the cathodes. Underneath the surface of the cathode 24 carrying the target there is provided a magnet 36 for generating a magnetic field necessary to execute the RF magnetron sputtering. A sputtering gas is introduced by way of a gas introduction line 38. The deposition chamber 20 is designed to be evacuated through a vacuum exhaust piping. Moreover, a heater 40 for heating the substrate 32 is placed above the turntable 22.

Furthermore, the deposition system 20 includes series circuits each made up of a combination of change-over switches 44a, 44b, 44c, low-pass filters 46a, 46b, 46c, and DC voltage sources 48a, 48b, 48c, respectively, extending from connection point between the corresponding cathode 24 and the associated matching box 42 to the ground. Preferably the voltage values of the D.C. voltage sources 48a, 48b, and 48c are adjustable. In the illustrated embodiment, this series circuit is separately provided for each of the cathodes 24, but instead it may be exclusively provided for the cathodes required depending on the design.

The following description will be made of a preferred embodiment of a method of forming a thin oxide film in accordance with the present invention. In this example, the thin oxide film has its thickness of below about 1 μm.

The thin oxide film to be formed in this embodiment is a two-layer junction film including first and second thin oxide films each having the same chemical compositional elements. The composition in this case comprises Y(yttrium)—Ba(barium)—Cu(copper)—O(oxygen). Excepting target and target cathode voltage, other film formation conditions common to the formations of the first and second thin oxide films are unchangingly fixed not only during the formation of the junction film having a single junction but also during the continuous formation of the first and second thin oxide films on both side of junctions in the case of the junction film having two or more junctions. The preferred example of these film formation conditions, that is, atmospheric conditions, is as follows.

| Common film formation Conditions | |
|---|---|
| Discharge Frequency (RF) | 94.92 MHz |
| RF Power | 60W |
| Substrate | $SrTiO_3$ (100) |
| Substrate Temperature | 700 to 780° C. |
| Sputtering Gas | Ar + $O_2$ (Mixed Gas) |
| Sputtering gas pressure | 200 m Torr (Ar: 100 m Torr; $O_2$: 100 m Torr) |

Under such common film formation conditions, a thin oxide film having one junction was made by setting individual or discrete film formation conditions for separately forming the first and second thin oxide films.

The following is a description of formation of the first and second thin oxide film and their respective characteristics, and then formation of the thin oxide film in the form of a junction film consisting of the first and second oxide films. Among the characteristics of the obtained films, chemical compositions were evaluated by inductively coupled plasma (ICP) spectroscopy, crystal orientations and lattice constants of the thin oxide films were examined by X-ray diffractometry, and electrical characteristics were ascertained by D.C. 4-terminal method or D.C. 3-terminal method.

(1) First Thin Oxide Film (Thin Oxide Film Superconductor)

A compound oxide target was used as a target. As is well known, the term "compound" means that a plurality of cations are contained therein. This example employed a compound oxide target comprising Y(yttrium)—Ba(barium)—Cu(copper)—O(oxygen), in other words, a first target including three kinds of cations of Y, Ba, and Cu. The first target preferably comprises a $YBa_3Cu_7O_u$. The target 28a is a sintered one. As is well known, it is to be appreciated in the case of targets that although the target is represented by $YBa_3Cu_7O_u$ herein, the representation does not mean the presence of a crystal structure of Y:Ba:Cu=1:3:7, but merely means that the chemical compositional ratio of the constituent elements is Y:Ba:Cu=1:3:7.

First, the $SrTiO_3$ substrate 32 is placed on the turntable 22 in position while the first target 28a is mounted on one of the cathodes 24. At that time, a (100) plane of the substrate is a surface to be deposited thereon. The turntable 22 is rotated for the positional adjustment to allow the substrate 32 to confront the first target 28a.

After the setting of the substrate temperature and the gas pressure, a switch 44a is closed with the other switches 44b and 44c remaining opened, thereby connecting the cathode 24 carrying the first target 28a thereon with the RF power source 26 by way of the matching box 42 and with the D.C. voltage source 48a via the low-pass filter 46a. It is to be noted in this embodiment that the voltage of the D.C. voltage source 48a is so set that the voltage at the target cathode presents minus 100 V. In other words, the voltage of minus 100 V is impressed as the target cathode voltage onto the cathode 24 by means of the external D.C. voltage source 48a. As a result, the associated RF power source 26 is actuated to initiate a discharge. The shutter 30 associated with the cathode 24 confronting the substrate 32 and having the first target 28a mounted thereon is opened, and the target 28a is sputtered to initiate the film formation.

The sputtering gas is ionized into sputtering gas ions with the aid of energy supplied from the RF power Source 26, and the target 28a is sputtered by the sputtering gas ions. The atoms dislodged from the surface of the target 28a arrive the substrate 32 placed on turntable 22, the atoms being crystallized by the heat emitted fri-om the heater 40 to form the thin oxide film on the substrate 32. The film thickness obtained was 1000 angstroms by way of example. The film formation rate was 0.12 angstroms per second.

After the completion of the formation, the thin oxide film is cooled down to room temperature in oxygen at one atmosphere, and then the substrate 32 coated with the thin oxide film is retrieved.

In order to evaluate the obtained thin oxide film, the chemical composition, crystal orientation, lattice constant and electrical characteristics thereof were examined by the use of the techniques as previously described.

Figure 2:
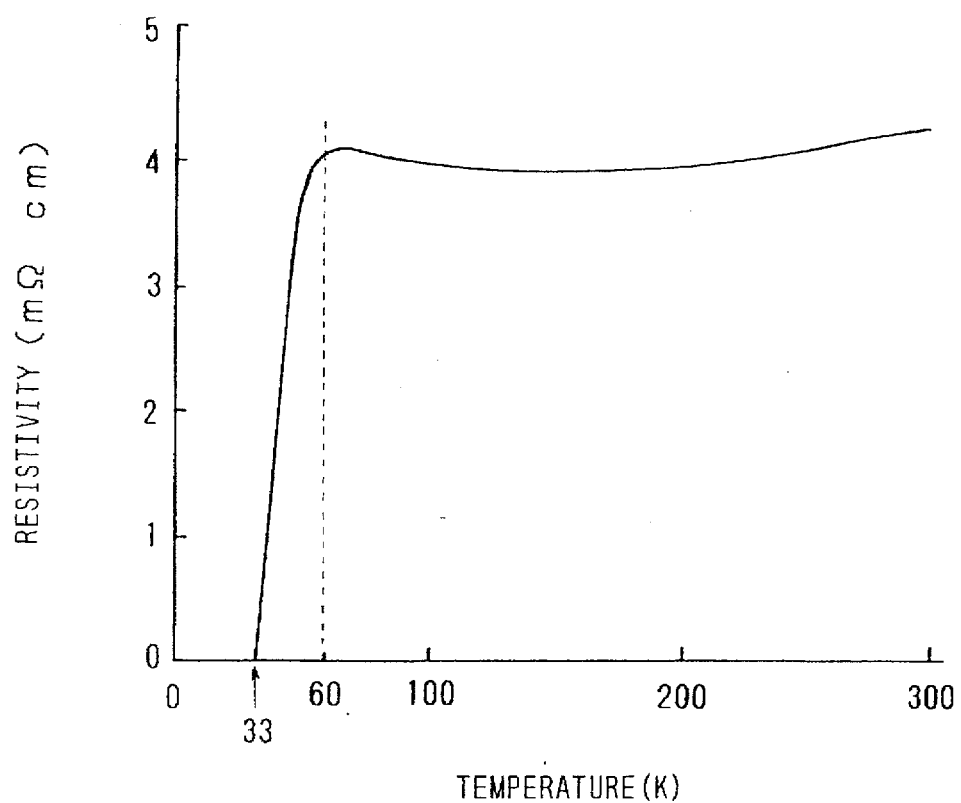
FIG. 2 shows a measurement result of resistivity to temperature characteristics of a thin oxide film presenting superconductivity which has been formed by a film formation method in accordance with the present invention.

Chemical composition analysis shows that a first thin oxide film was found with a chemical composition of substantially Y:Ba:Cu=1:2:3 using $YBa_3Cu_7O_u$ target as the first target 28a with a cathode voltage of minus 100 V at the D.C. voltage source 48a connected to the RF power source 26a and the matching box 42 by way of the low-pass filter 46a. The first thin oxide film is therefore represented as $YBa_2Cu_3O_x$ (note that x represents a component of compositional ratio which is a value satisfying $6.35<x<7$). As already known, the oxide having the composition ratio of Y, Ba and Cu substantially equal to 1:2:3 presents superconductive characteristics, and hence this first thin oxide film also will exhibit superconductivity. For the verification thereof, resistivitytemperature characteristics of the thin oxide film were evaluated in a temperature region indicating the superconductive characteristics. The results are shown in FIG. 2.

In this Figure, the abscissa represents the temperature (in degrees Kelvin) while the ordinate represents the resistivity (in milliohmcentimeters). As seen from the characteristics curve obtained through the measurement, this first thin oxide film presents the onset of the superconductive transition at 60 K and zero resistivity at 33 K.

Figure 3:
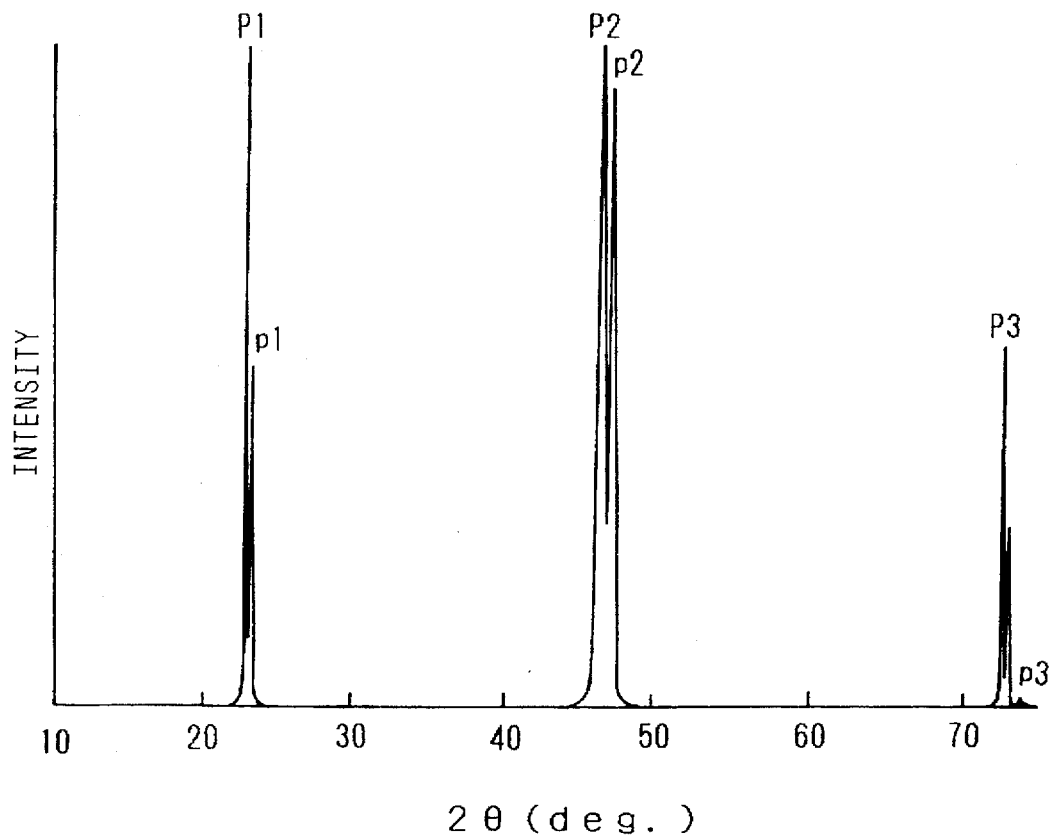
FIG. 3 shows a measurement result of X-ray diffraction patterns of a first thin oxide film presenting superconductivity which has been formed by the film formation method in accordance with the present invention.

FIG. 3 illustrates a X-ray diffraction pattern with respect the first thin oxide film. In this figure, the abscissa represents an angle which is double the angle θ of incidence of X-ray (2θ:in degrees) while the ordinate represents the intensity of the X-ray diffraction. It is to be noted that the measurement was made with 2θ lying within the range of 10° to 75°. In FIG. 3, the peaks P1, P2 and P3 represent diffraction peaks each corresponding to the $SrTiO_3$ substrate 32. There also appear other peaks p1, p2, and p3 immediately on the right of the peaks P1, P2 and P3, respectively. More specifically the peaks p1(23.140), p2(47.211), and p3(73.79°) are diffraction peaks derived from (100) plane, (200) plane, and (300) plane of $YBa_2Cu_3O_x$, respectively. Based on these experimental results, it has tuned out that the first thin oxide film has "a-axis" orientation. Besides, as is clear from FIG. 3, the lattice constant "a" is 3.85 angstroms. Therefore, the first thin oxide film presents a superconductive characteristic, and accordingly includes a crystal structure comprising $YBa_2Cu_3O_x$.

(2) Second Thin Oxide Film (Thin oxide Film Insulator or Semiconductor)

Unlike the case of the first thin oxide film as described above, the thin oxide film was solely formed by the use of a composite target consisting of the first target and a second target comprising the same constituent elements as the first target but different compositional ratio. The second target is represented as $YBa_2Cu_5O_y$. Although the second target is also represented in the form of $YBa_2Cu_5O_y$, this representation does not mean the presence of the crystal structure of Y:Ba:Cu=1:2:5, but merely, eans Ihlit the chemical compositional ratio of elements Y, Ba and Cu constituting the second target is 1:2:5.

This target also is a sintered one. For the execution of the film formation, the second target designated at 28b used in lieu of the first target is placed on the cathode 24 in the same manner as the formation of the first thin oxide film. Films formation conditions to be employed at that time and film forming processes of the system are the same as the formation conditions and the processes in the case of the first thin oxide film with the exception of changing the target cathode voltage. In this case, therefore, the swithes 44a, 44b and 44c remain opened (disconnecting state) so as to disconnect the external D.C. voltage sources 48a, 48b, and 48c from their corresponding cathodes.

Regarding the target cathode voltage, the absolute value of first target cathode voltage is greater than the absolute value of the second target cathode voltage. In this embodiment, the target cathode voltage employed in this embodiment was self-bias voltage of minus 50 volts which is determined by sputtering conditions (such as the kind of sputtering gas to be used, sputtering gas pressure, discharge frequency, and input power) as well as system configuration (such as area ratio between the electrodes). The film formation rate of the second thin oxide film onto the (100) plane of the $SrTiO_3$ substrate was 0.02 angstroms/second (which rate is one-sixth of that of the first thin oxide film) with the film thickness of 400 angstroms. In this manner, the formation of the second thin oxide film can be effected at a lower growth rate as described above under conditions of a relatively low self-bias voltage of about minus several tens of volts and a relatively high pressure atmosphere of several hundred mTorr, which ensures an easier control of film thickness than the prior art. Consequently, the thickness of the second thin oxide film can be also controlled to lie under several decades (tens) angstroms.

After the completion of film formation, the resultant thin oxide film is cooled down to room temperature under one atmosphere pressure oxygen followed by retrieval of the substrate 32 coated with the second thin oxide gilm.

In order to evaluate the obtained thin oxide film, the chemical composition, crystal orientation, lattice constant, and electric characteristics thereof were examined by the use of the techniques as previously described.

Figure 4:
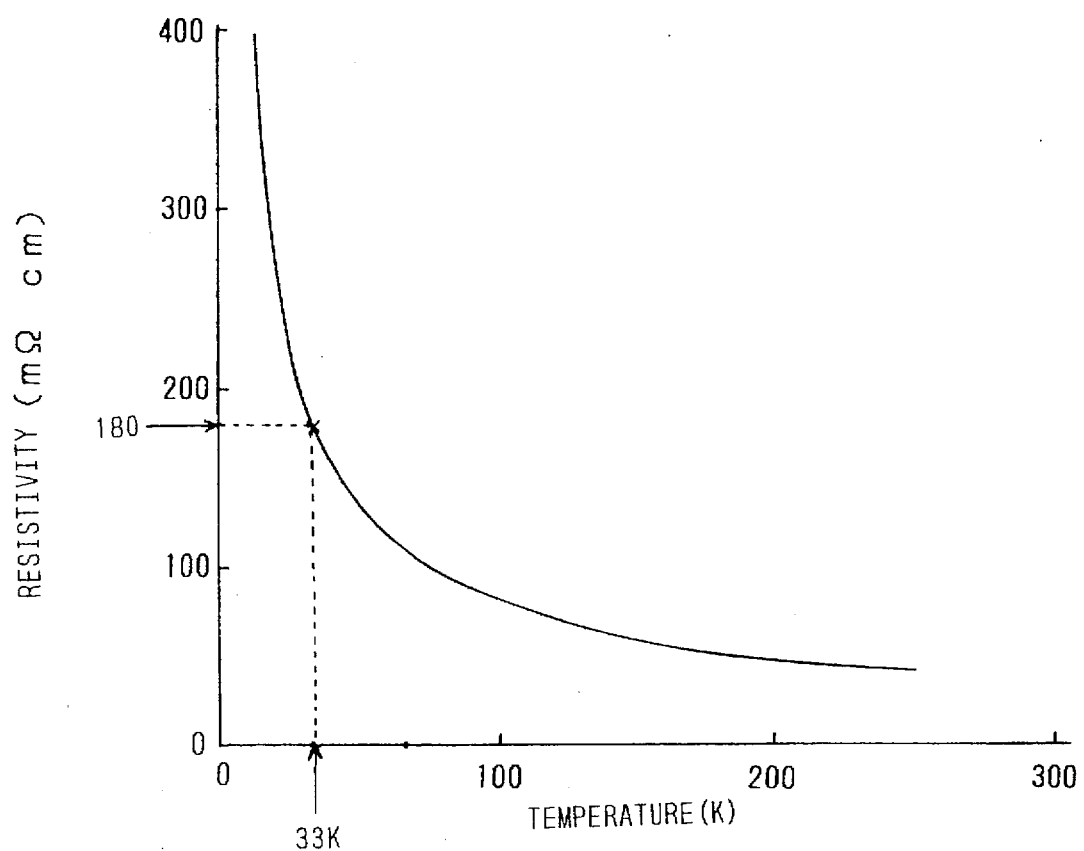
FIG. 4 shows a measurement result of the resistivity to temperature characteristics of a thin oxide film presenting insulator properties or possibly semiconductive properties which has been formed by the film formation method of the present invention.

Consequently, chemical composition analysis of the second thin oxide film obtained by using the $YBa_2Cu_5O_y$ target as the second target 28b with the target cathode voltage of minus 50 V provided by self-bias, showed that the chemical composition thereof is substantially represented as Y:Ba:Cu=1:2:3 which is the same as that of the above-described first thin oxide film. In other words, it is supposed that the second thin oxide film has cation ratio, that is, a compositional ratio of Y:Ba:Cu=1:2:3 or a compositional ratio close to that. Here, this second thin oxide film is represented as $YBa_2Cu_3O_y$ for the sake of convenience (note that y represents a component of the compositioal ratio which is a value satisfying 6<y<6.35). It is to be noted in the second thin oxide film that if the content of any one element among Y, Ba and Cu is employed as a basis of comparison, the contents ol the other two elements lie within deviations of the order of 10% from the foregoing compositional ratio. As already known, the oxide having the compositional ratio among Y, Ba and Cu substantially equal to 1:2:3 generally exhibits superconductivity. It might therefore be supposed that the present second thin oxide film would also exhibit superconductivity. Hence, for the purpose of verification the resistivity-temperature characteristics of the second thin oxide film were examined in the temperature range showing the superconductivity. FIG. 4 illustrates the results.

In FIG. 4, thc abscissa represents the temperature (unit: K) while the ordinate represents the resistivity (unit: mΩcm (milliohm-centimeter)). As can be seen film the characteristic curve obtained by measurement, this second thin oxide lilm presents semiconductive characteristics in a relatively high ltemperature range and presents insulation characteristics in l remarkably low temperature. In this manner, it has turned out that the second thin oxide film is a substance presenting both the semiconductive characteristics and the insulation characteristics, depending on the temperature range, without presenting superconductivity.

Thus, as shown in FIG. 4, the resistivity of the second film increases dramatically as the temperature decreases, while FIG. 2 shows that the resistivity of the first film (superconductor) decreases dramatically as the temperature decreases. Namely, the resistivity of the second film increases asymptotically in the temperature range below 60 K (see FIG. 2). That is to say, where the first film experiences plummeting resistivity in a range below 60 K, the resistivity of the second film increases rather than decreases asymptotically. From this fact, in the junction structure formed by the second oxide film as a semiconductor and the first oxide film exhibiting superconductivity in a temperature below a superconducting critical temperature, the second oxide film would be considered to effectively function as an insulator.

Figure 5:
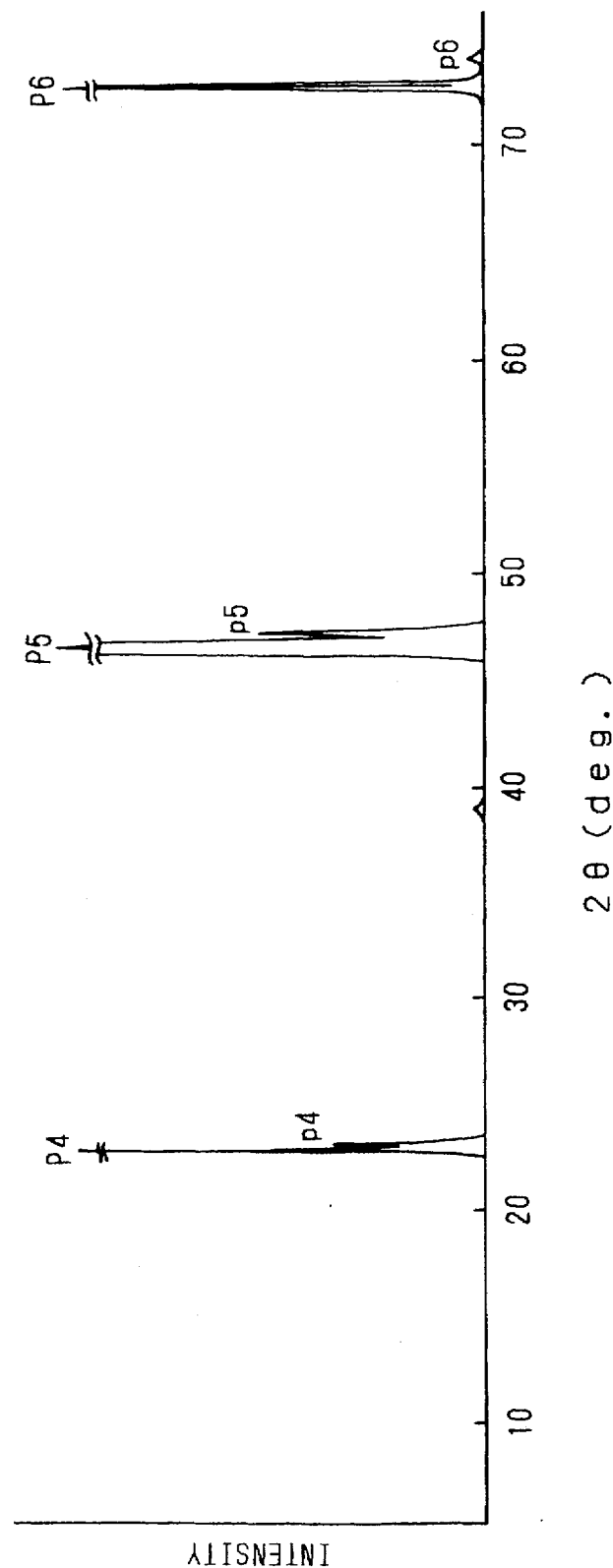
FIG. 5 shows a measurement result of the X-ray diffraction patterns of a second thin oxide film presenting ordinarily superconductive properties but capable of being used as an insulator in an extremely low temperature which has been formed by the film formation method of the present invention.

FIG. 5 shows X-ray diffraction patterns of the second thin oxide film, which is similar to FIG. 3. In FIG. 5, the abscissa represents an angle that is double the angle of incidence of X-fay (2θ: in degrees) while the ordinate represents the intensity of X-ray diffraction (unit: optionally). Note that the measurement was carried out within the range of 2θ from 100° to 75°. In FIG. 5, peaks P4, P5 and P6 show diffraction peaks each corresponding to $SrTiO_3$ substrate 32. In this figure, there appear other peaks p4, p5 and p6 immediately on the right of the corresponding peaks P4, P5 and P6. The peaks p4 (23.17°), p5 (47.34°) and p6 (73.98°) represent diffraction patterns, respectively derived from (100) plane, (200) plane and (300) plane ol $YBa_2Cu_3O_y$.

As can be understood lrom the results of FIG. 5, this second thin oxide flilm includes crystals having "a-axis" orientation and a lattice constant "a" of 3.84 angstroms which is extremely close to the lattice constant 3.85 angstroms of the first thin oxide film. Based on this fact, the same deposition chamber can be used for a continuous formation of the first and second thin oxide films, thereby ensuring a formation of the thin oxide film including junction film consisting of both the films.

The lattice constants of the first and second oxide films fit in well with lattice constants ao of $YBa_2Cu_3O_7$-δ reported by J.D. Jorgensen; Pys. Rev., B41, pp. 1863–1877 (1990), FIGS. 5 and 6, and Table II. The report exhibited that the lattice constants of a Y—Ba—Cu—O films depend on the amount of oxygen in the films. From the report, each of the first and second oxide films has lattice constants $a_o$, $b_o$ and $c_o$ within the range of $a_o$=3.82–3.86 Å, $b_o$ =3.89–3.86 Å and $c_o$=11.68–11.82 Å.

Figure 6:
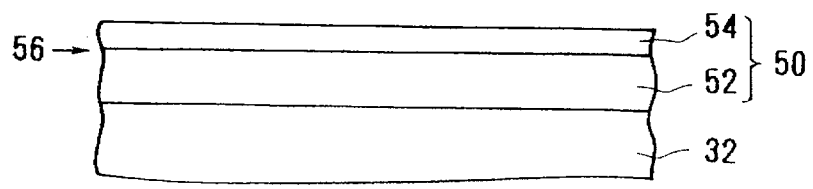
FIG. 6 is a schematic sectional view showing an exemplary thin oxide film having one junction which has been provided by the method of forming the thin oxide film in accordance with the present invention.

(3) Formation of Thin Oxide Junction Film The first and second thin oxide films were successively formed without any interruption of time in one and the same deposition chamber, thereby sequentially forming the first thin oxide film and then the second thin oxide film onto the substrate to consequently produce a thin oxide film 50 having one junction. FIG. 6 is a schematic sectional view of the thin oxide film 50. In this case, the first and second thin oxide films were formed under their respective film formation conditions which have been already described. It should be noted that the absolute value of the first target cathode voltage is greater than the absolute value of the second target cathode voltage. At the time of formation of the first thin oxide film 52, the change-over switch 44a was closed (connecting state) while disconnecting (opening) the other change-over Switches 44b and 44c. Correspondingly, the shutter confronting the target 28a was opened while all the other shutters were closed. After the formation of the first thin oxide film 52, the switch 44a was disconnected, and simultaneously the turntable was rotated into a position where the substrate 32 faces the second target.

At the same time, the shutter confronting the first target 28a was closed, and the sluttet facing the second target 28b was opened to form the second thin oxide film 54 onto the first thin oxide film 52 which had been previously formed.

Regarding the film thickness, it is preferable to select that the second thin oxide film has less than one-half the thickness of the first thin oxide film. If the thickness of the first thin oxide film is selected to be about 1000 angstroms, the second thin oxide film preferably has a thickness of below about 500 angstroms. Although the film formation conditions in this embodiment were the same as the previously described conditions in that the film thickness of the first thin oxide film 52 was 1000 angstroms, the film thickness of the second thin oxide film 54 was about 100 angstroms. In FIG. 6, the junction is designated by a reference numeral 56.

The resistivity-temper-ature characteristics of the second thin oxide film 54 consisting one part of thin oxide film 50 were measured by the D.C. 4-terminal method with the result that its behavior is same as the characteristics of the unitary film shown in FIG. 4 and that the second thin oxide film 54 itself presents both semiconductive characteristics and insulation characteristics, depending on temperature. In addition, exposed surface of second thin oxide film 54 was etched to a depth of about 500 angstroms toward the underlying first thin oxide film 52 with the aid of Ar (argon) ions, so that the fist thin oxide film 52 was entirely exposed to measure that resistivity-temperature characteristics by the D.C. 4-terminal method. Consequently, the resistivity-temperature characteristics of the first thin oxide film 52 in this combination present the same behavior as the characteristics of the unitary film shown in FIG. 2, that is, present superconductive characteristics.

Through the ICP (inductively coupled plasma) analysis of the junction thin film 50 including the first and second thin oxide films 52 and 54, the chemical compositional ratio was found to be substantially Y:Ba:Cu=1:2:3. Due to having this chemical compositional ratio and the resistivity-temperature characteristics described above, it has turned out that the first thin oxide film 52 is a film showing the superconductivity, whereas the second thin oxide film 54 is a film showing the insulation characteristics or the semiconductive characteristics.

The product thus formed is a composite junction film formed by first and second Y—Ba—Cu—O films that are contiguous to each other and have the stated electrical conductive characteristics. The first and second oxide films are different in oxygen content from each other. The first oxide film acts as a superconductor in an appropriate temperature range and the second oxide film is effective as an insulator within that temperature range, but not as a semiconductor above that range.

Naturally, the present invention is not confined to the above embodiments, and a variety of modifications or changes can be made without departing from the spirit or essential character thereof. For example, although the chemical composition of the first and second targets was Y—Ba—Cu—O in the above embodiment, it is not intended to be limited to this. Any target is applicable as long as it includes elements and a chemical composition ensuring that the first thin oxide film to be finally successively formed has a chemical composition represented as $YBa_2Cu_3O_{z1}$ (note that the component z1 of the compositional ratio is a value satisfying $6.35 < z1 < 7$ and that the second thin oxide film has a chemical composition represented as $YBa_2Cu_3O_{z2}$ (note that the component z2 of the compositional ratio is a value satisfying $6 < z2 < 6.35$) or a chemical compositional ratio close to that.

Naturally, the substrate is not limited to the $SrTiO_3$ substrate merely employed by way of example. Any other substrate is applicable provided it is made of a material suitable for the film formation such as MgO and $NdGaO_3$ so that the elements constituting the substrate and film do not bring about a great interdiffusion between the substrate and the formed film.

In the above embodiments, the film formation was effected by the RF magnetron sputtering method by way of example, but instead the RF sputtering method may be employed.

Moreover, the above embodiments are intended to present a single junction between the first and second thin oxide films, but instead the formation of the first and second thin oxide films may be successively repeated in sequence to provide a thin oxide film having two or more junctions.

Additionally, among the above-described film formation conditions, there may be appropriately changed the conditions to which particular references have not been made depending on the design.

As is clear from the above description, the present invention in one of its aspects uses the targets made of same constituent elements to separately form a first thin oxide film and a second thin oxide film, changing only the voltage to be impressed on the target cathode. The first thin oxide film exhibiting superconductivity, and the second thin oxide film ordinarily presents a semiconductive characteristics while being used as insulator in an extremely low temperature range, thus ensuring a successive film formation of the first and second thin oxide films in the same deposition chamber without any interruption of time. In consequence, the thin oxide film which has been formed to include at least one junction is free from the mixture of contaminant into its junction interfacial area and from the formation subjected to the change of properties due to the contaminiant. Therefore, the thin oxide film which has been formed in accordance with the present invention has a superior film quality and film characteristics as well as less possibility of deterioration in these characteristics as compared with the conventional thin oxide film.

According to the present invention, even if the first thin oxide film is oxidized to impart superconductivity after the film formation, the second thin oxide film is not allowed to present a superconductivity.

Furthermore, a couple of thin oxide films can be successively informed in the same deposition chamber with a superior film quality and junction properties, and hence the present invention ensures a remarkably improved production efficiency of the thin oxide film as compared with the conventional method.

Moreover, in the thin junction oxide film formed in accordance with the present invention, the films resting on both sides of the junction have substantially the same lattice constant, and accordingly the lattice mismatching lessens, thus enabling an epitaxial growth of the semiconductor constituent material onto this thin oxide film.

Due to such advantages, thus formed thin oxide film is suitable for the use in the formation of devices having superconductive characteristics such as Josephson elements or superconducting circuitry.

What is claimed is:

1. A process for forming a composite junction film in which a composite oxide target is sputtered by means of a sputtering method using a discharge frequency, said process comprising the steps of:

forming a first crystalline oxide $YBa_2Cu_3O_x$ film, wherein an oxygen ratio in the first oxide film is $6.35 < x < 7$, said first $YBa_2Cu_3O_x$ film exhibiting superconductivity at a first temperature range; and forming a second crystalline oxide $YBa_2Cu_3O_y$ film, wherein an oxygen ratio in the second oxide film is $6 < y < 6.35$, said second $YBa_2Cu_3O_y$ film being semiconductive, but in the first temperature range where said first film exhibits superconductivity, said second film has increased resistance so that said second film is effective as an insulator;

wherein said first oxide film and said second oxide film are sequentially formed so as to be contiguous to each other, in a sputtering apparatus where a first target and a first target cathode voltage are used to form the first oxide film, and a second target and a second target cathode voltage are used to form the second oxide film, and wherein during said formation of said first oxide film and said second oxide film, the absolute value of the first target cathode voltage is greater than the absolute value of said second target cathode voltage while maintaining RF power, RF frequency in a range from approximately 13.56 MHz to 94.92 MHz, substrate temperature, sputtering gas, and sputtering gas pressure at the same conditions.

2. A process for forming the composite junction film according to claim 1 wherein a self-bias voltage of said second target is used as said second target cathode voltage to form the second oxide film.

3. A process for forming the composite junction film according to claim 1 wherein said first target cathode voltage is impressed by the use of an external D.C. voltage source for forming the first oxide film.

4. A process for forming the composite junction film according to claim 1 further comprising the step of forming said first oxide film and said second oxide film successively to provide a junction interface lying between said first oxide film and said second oxide film.

5. A process for forming the composite junction film according to claim 1 wherein said targets for forming said first oxide film and said second oxide film comprise Y—Ba—Cu—O targets.

6. A process for forming the composite junction film according to claim 1 wherein said target for forming said first oxide film comprises an oxide target having a chemical compositional ratio of approximately Y:Ba:Cu=1:3:7, and wherein said target used for forming said second oxide film comprises an oxide target having a chemical compositional ratio of approximately Y:Ba:Cu=1:2:5.

7. A process for forming the composite junction film according to claim 6, wherein the absolute value of said first target cathode voltage is about 100 volts and the absolute value of said second target cathode voltage is about 50 volts.

8. A process for forming the composite junction film according to claim 1 wherein said first oxide film has a thickness of about 1000 angstrom units which is greater than the thickness of said second oxide film.

9. A process of forming the composite junction film according to claim 1, wherein said first oxide film has a thickness of about 1000 angstrom units and said second oxide film has a thickness below about 500 angstrom units.

10. A process for forming the composite junction film according to claim 1, wherein said sputtering method is a high-frequency magnetron sputtering method.

11. A process for forming a composite junction film by a high-frequency magnetron sputtering process which includes:

sputtering a first target containing Y—Ba—Cu in a ratio of substantially 1:3:7 at a first target cathode voltage having an absolute value which is greater than the absolute value of a second target cathode voltage, to form a first oxide film of $YBa_2Cu_3O_x$; and then sputtering a second target containing Y—Ba—Cu in a ratio of substantially 1:2:5 at said second target cathode voltage to form a second film of $YBa_2Cu_3O_y$ upon the surface of said first oxide film, wherein an oxygen ratio in said first oxide film is $6.35<x<7$ and an oxygen ratio in said second oxide film is $6<y<6.35$, thereby to form an interface between said first oxide film and second oxide film;

wherein, during formation of said first oxide film and second oxide film, RF power, RF frequency in a range from approximately 13.56 MHz to 94.92 MHz, substrate temperature, sputtering gas, and sputtering gas pressure are maintained at the same conditions, and wherein said the second oxide film is semiconductive, but in a temperature range where said first oxide film exhibits superconductivity, the resistance of said second oxide film is sufficiently high so that said second oxide film is effective as an insulator.

12. A process for forming the composite junction film according to claim 11, wherein a thickness of said first oxide film is less than one-half of that of said second oxide film.

* * * * *